(12) United States Patent
Osterwald et al.

(10) Patent No.: US 10,607,962 B2
(45) Date of Patent: Mar. 31, 2020

(54) METHOD FOR MANUFACTURING SEMICONDUCTOR CHIPS

(71) Applicant: Danfoss Silicon Power GmbH, Flensburg (DE)

(72) Inventors: Frank Osterwald, Kiel (DE); Martin Becker, Kiel (DE); Holger Ulrich, Eisendorf (DE); Ronald Eisele, Surendorf (DE); Jacek Rudzki, Kiel (DE)

(73) Assignee: DANFOSS SILICON POWER GMBH, Flensburg (DE)

( * ) Notice: Subject to any disclaimer, the term of this patent is extended or adjusted under 35 U.S.C. 154(b) by 0 days.

(21) Appl. No.: 15/751,984

(22) PCT Filed: Jul. 26, 2016

(86) PCT No.: PCT/EP2016/067792
§ 371 (c)(1),
(2) Date: Feb. 12, 2018

(87) PCT Pub. No.: WO2017/029082
PCT Pub. Date: Feb. 23, 2017

(65) Prior Publication Data
US 2018/0240776 A1    Aug. 23, 2018

(30) Foreign Application Priority Data

Aug. 14, 2015 (DE) ......................... 10 2015 113 421

(51) Int. Cl.
*H01L 23/00* (2006.01)
(52) U.S. Cl.
CPC .............. *H01L 24/94* (2013.01); *H01L 24/92* (2013.01); *H01L 24/97* (2013.01);
(Continued)

(58) Field of Classification Search
CPC .......... H01L 24/94; H01L 24/92; H01L 24/97
See application file for complete search history.

(56) References Cited

U.S. PATENT DOCUMENTS

| | | |
|---|---|---|
| 2,009,039 A | 7/1935 | Armington |
| 5,300,458 A | 4/1994 | Kuhnert et al. |
| | (Continued) | |

FOREIGN PATENT DOCUMENTS

| | | |
|---|---|---|
| CN | 101339934 B | 4/2011 |
| DE | 19612838 A1 | 5/1997 |
| | (Continued) | |

OTHER PUBLICATIONS

International Search Report for Serial No. PCT/EP2012/003786 dated Jan. 7, 2013.

(Continued)

*Primary Examiner* — Ermias T Woldegeorgis
(74) *Attorney, Agent, or Firm* — McCormick, Paulding & Huber PLLC

(57) ABSTRACT

A method for manufacturing semiconductor chips (2, 3) having arranged thereon metallic shaped bodies (6), having the following steps: arranging a plurality of metallic shaped bodies (6) on a processed semiconductor wafer while forming a layer arranged between the semiconductor wafer and the metallic shaped bodies (6), exhibiting a first connection material (4) and a second connection material (5), and processing the first connection material (4) for connecting the metallic shaped bodies (6) to the semiconductor wafer without processing the second connecting material (5), wherein the semiconductor chips (2, 3) are separated either prior to arranging the metallic shaped bodies (6) on the semiconductor wafer or after processing the first connection material (4).

11 Claims, 3 Drawing Sheets

(52) U.S. Cl.
CPC ............... *H01L 2224/291* (2013.01); *H01L 2224/32225* (2013.01); *H01L 2224/48491* (2013.01); *H01L 2224/83002* (2013.01); *H01L 2224/8384* (2013.01); *H01L 2224/83447* (2013.01); *H01L 2224/83986* (2013.01); *H01L 2224/9221* (2013.01); *H01L 2224/9222* (2013.01); *H01L 2224/94* (2013.01); *H01L 2224/97* (2013.01)

(56) References Cited

U.S. PATENT DOCUMENTS

| | | | |
|---|---|---|---|
| 5,414,299 A | 5/1995 | Wang et al. | |
| 5,510,650 A | 4/1996 | Erskine, Jr. | |
| 5,986,338 A | 11/1999 | Nakajima | |
| 6,055,148 A | 4/2000 | Grover | |
| 6,100,112 A | 8/2000 | Amano et al. | |
| 6,137,159 A | 10/2000 | Tsubosaki et al. | |
| 7,498,671 B2 | 3/2009 | Fujiwara et al. | |
| 2002/0036055 A1 | 3/2002 | Yoshimura et al. | |
| 2003/0162382 A1 | 8/2003 | Aono et al. | |
| 2005/0017740 A1* | 1/2005 | Higashitani | H01L 21/4857 361/728 |
| 2005/0247760 A1 | 11/2005 | Palm | |
| 2005/0276934 A1 | 12/2005 | Fukui et al. | |
| 2007/0018338 A1 | 1/2007 | Hosseini et al. | |
| 2007/0246833 A1 | 10/2007 | Soga et al. | |
| 2007/0278550 A1* | 12/2007 | Asai | H01L 21/6835 257/306 |
| 2007/0284722 A1 | 12/2007 | Standing | |
| 2008/0246130 A1 | 10/2008 | Carney et al. | |
| 2009/0008775 A1 | 1/2009 | Tanaka et al. | |
| 2009/0023250 A1 | 1/2009 | Speckels et al. | |
| 2010/0078463 A1 | 4/2010 | Speckels et al. | |
| 2010/0207263 A1 | 8/2010 | Nikitin et al. | |
| 2011/0075451 A1 | 3/2011 | Bayerer et al. | |
| 2011/0079792 A1 | 4/2011 | Lostetter et al. | |
| 2013/0084679 A1 | 4/2013 | Stolze et al. | |
| 2014/0061909 A1 | 3/2014 | Speckels et al. | |
| 2014/0225247 A1 | 8/2014 | Becker et al. | |
| 2014/0230989 A1 | 8/2014 | Becker et al. | |
| 2015/0014865 A1* | 1/2015 | Frueh | H01L 24/27 257/783 |

FOREIGN PATENT DOCUMENTS

| | | | |
|---|---|---|---|
| DE | 102004036905 A1 | 3/2006 | |
| DE | 102005047566 A1 | 4/2007 | |
| DE | 102007025950 A1 | 1/2008 | |
| DE | 102008050798 A1 | 4/2010 | |
| DE | 102005054872 B4 | 4/2012 | |
| DE | 102011115886 A1 | 4/2013 | |
| DE | 102012201935 A1 | 8/2013 | |
| DE | 102012202281 A1 | 8/2013 | |
| DE | 102014109766 B3 | 4/2015 | |
| EP | 0520294 A1 | 12/1992 | |
| EP | 1772900 A2 | 4/2007 | |
| EP | 2390914 A1 | 11/2011 | |
| JP | S56101752 A | 8/1981 | |
| JP | 2003229527 A | 8/2003 | |
| JP | 2008016818 A | 1/2008 | |
| KR | 20170030542 A * | 3/2017 | ............ H01L 24/48 |
| WO | 2006012847 A1 | 2/2006 | |
| WO | 2008006340 A1 | 1/2008 | |
| WO | 2013053419 A1 | 4/2013 | |

OTHER PUBLICATIONS

International Search Report for Serial No. PCT/EP2012/003787 dated Jan. 7, 2013.

Danish Office Action for Serial No. 102011115887.5 dated Dec. 11, 2013.

Danish Office Action for Serial No. 102011115887.5 dated Nov. 25, 2011.

International Search Report for Application No. PCT/EP2016/067792 dated Nov. 22, 2016.

* cited by examiner

METHOD FOR MANUFACTURING SEMICONDUCTOR CHIPS

CROSS-REFERENCE TO RELATED APPLICATION

This application is a National Stage application of International Patent Application No. PCT/EP2016/067792, filed on Jul. 26, 2016, which claims priority to German Patent Application No. 10 2015 113 421.7 filed on Aug. 14, 2015, each of which is hereby incorporated by reference in its entirety.

TECHNICAL FIELD

The invention relates to a method for manufacturing semiconductor chips. The invention also relates to a method for manufacturing semiconductor modules. The invention finally also relates to semiconductor chips and wafers.

BACKGROUND

In order to develop long-life and robust power semiconductor modules, high thermal and electrical demands are placed in particular on the upper and lower connection point of the semiconductor (upper side and lower side). The lower side of the semiconductor is usually contacted by means of a solder connection or partly also by means of a sintered or diffusion-soldered connection.

As a standard, the upper side of the semiconductor exhibits a metallization or metal layer that is optimized for the bonding process of thick aluminium wires. Despite the expansion-intensive metallization layers on the upper and lower side of the semiconductor, for reducing electrical losses the semiconductors still become ever thinner. At present, power semiconductors are on the market having a total thickness of only approximately 70 µm.

To increase the reliability of the upper-side contact on the chip it is for example known from DE 10 2011 115 886 A1 to apply a metallic shaped body (copper film) on the chip contacts and to carry out the sintering prior to the wire bonding.

The advantages obtained by the use of metallic shaped bodies to create a connection of a semiconductor chip comprising upper side electrical contacts to thick wires or strips particularly include that neither during bonding nor by preceding or subsequent steps there is a risk of damaging the thin metallisation layers which form the electrical contact structures of the semiconductor. The thermal or mechanical forces involved, for example, in the welding, brazing, sintering or ultrasonic welding of thick wires or strips are at least partially absorbed by the metallic shaped bodies and so reduce the size of such forces transmitted to the semiconductor chip.

Similarly, the metallic shaped bodies may form a mechanical protection of the surfaces, in particular across the electrical contacts of the semiconductor, from frictional contacting test processes (high current tests at wafer level). This permits a safe electrical test of the semiconductor before completing the upper side connection of the semiconductor. For the electrical test, the surface of the metallic shaped body that is bonded to the semiconductor is contacted by special spring tools without risking damage to the fine surface structures of the semiconductor.

In addition an improved current distribution may be achieved. With copper thick wire bonding (for example using up to 600 µm diameter wires), the current now runs from central fixing areas of the wires on the metallic shaped bodies in a distributed manner through the metallic shaped body to the corresponding electrical contacts of the semiconductor.

The metallic shaped body need not extend over the dimensions of the individual semiconductor, but may, in some embodiments, undercut parts of the upper side. In many instances, the size and shapes of metallic shaped bodies may reflect the precise pattern of the electrical contacts of the semiconductor chip. That is to say, the size of the metallic shaped body reflects the size of the electrical contact that it is associated with, and it does not need to extend beyond that area. In other situations, it may extend beyond that area, but not extend beyond the edge of the upper surface of the semiconductor chip.

However, the disadvantage with the procedure described in DE 10 2011 115 886 A1 is that adhesively/cohesively contacting the metallic shaped body by sintering on the wafer that has not yet been separated leads to a strong deformation by bending or warping of the wafer since the differences in the coefficients of thermal expansion of copper (Cu) and silicon (Si) are large and the sintering process takes place at relatively high temperatures (approx. 260° C.) at a relatively high pressure (approx. 10-40 MPa). The thinner the wafer and the thicker the metallic shaped body, the more critical therefore the warpage will be.

In addition, for carrying out the known method also a complicated apparatus is required that has to provide both a high pressure and a high temperature so as to implement the pressure-sintering process on the wafer without at the same time destroying the wafer.

Despite this, in the following processes it is difficult to handle a wafer having a strong warpage.

As early as during the separation a strongly warped wafer will lead to breakages or edge chipping and at the latest during further processing during sintering on the substrate or during subsequent wire bonding, chip breakages on account of the resulting bending stress are very likely.

The alternative, to apply (adhere) the metallic shaped bodies onto the chips in a separate population process would mean that two population processes are necessary, as a result of which the process times and thus the process costs increase. Therefore it would be advantageous if the chip already had a metallic shaped body positioned on the surface during the population on the substrate.

SUMMARY

The object of the invention is therefore to provide a method for manufacturing a semiconductor chip that enables a metallic shaped body to be placed on the semiconductor chip prior to picking off from the wafer film and the population on the substrate without a deformation of the type of a bending or warpage of the wafer taking place.

To place the metallic shaped bodies on the chip and to hold them safely in position during the pick and place process it is necessary to immobilize temporarily the metallic shaped body and the connection layer previously applied either to the metallic shaped body or to the wafer (by means of auxiliary fastening), to be precise such that the vacuum tool for taking up the chip, to which the metallic shaped body is applied, can grip it safely on the upper side of the metallic shaped body, pick it up from the wafer film, bring it to the prepared substrate position and place it there possibly at a temperature and pressure and adhere it firmly in terms of position.

Placing metallic shaped bodies on the wafer advantageously takes place on the separated wafer that has already been tested electrically. Since after separation the chips are held on the wafer film very precisely in their original position (prior to the separation) it is conceivable to position the metallic shaped bodies using a carrier film, as it has already been described in DE 10 2011 115 886 A1. In this case the separation process of the wafer takes place without the need to take into account the metallic shaped bodies. This can be advantageous in particular if the separation process is carried out by means of sawing using flushing with water or by means of water-guided laser cutting or by means of other separation methods that use liquid media. In fact the risk would then exist that the liquid medium positions itself between the chip and the metallic shaped body and its connection material.

According to the invention, joining the shaped body (e.g. by sintering) is not carried out until after the wafer composite has been separated. That is, joining does not take place until the chip is simultaneously also joined at its lower side, e.g. in that the sintering process does not take place until the chip with the metallic shaped body lying thereon is placed on the substrate and both sides (upper and lower side of the chip) are simultaneously joined adhesively/cohesively. As a result, the chip is largely free from mechanical warpage and can be processed further without any damage.

Placing the metallic shaped bodies on the wafer after separation thus circumvents the risk of deformation by warping and edge chipping/chip breakages resulting therefrom.

The temporary immobilization (auxiliary fastening) of the metallic shaped bodies on the individual semiconductors (without forming a full-area adhesive/cohesive connection) can take place in different ways:

As a matter of principle, a provisional connection between the metallic shaped body and the chip, for example an adhesive connection, is to be produced by a single or a plurality of local (adhesive) connections, the subsequent functional large-scale connection taking place at a later step for example by means of a sintering paste and a sintering process.

For this purpose, preferably individual or a few (adhesive) points will immobilize the metallic shaped bodies on the chip. The first connection material, for example an adhesive, is here to be chosen such that safe fastening during the handling of the wafer and the pick and place process is ensured and the subsequent final fastening, e.g. by sintering, is not adversely effected. In particular adverse effects as a result of a mechanical strength that is too high, of a cross-linked adhesive or surface contamination of the subsequent (sintering) surfaces by the adhesive or by components of the adhesive (bleeding off) are to be avoided.

In addition it is conceivable that the adhering of the metallic shaped bodies takes place by means of volatile substances (such as e.g. alcohol) that are applied to the connection layer (dried sintering paste), but, however, largely evaporate shortly before or during the sintering process.

It may also make sense to use so-called sintering adhesives that make possible a connection method in several steps (adhering by means of an elastically acting adhesive connection and thermally/electrically conductive connection by sintering). These sintering adhesives are therefore arranged as a homogenous layer between the shaped body and the chip so that spatial separation of the first and second connection material does not take place.

According to the invention, there is therefore proposed a method for manufacturing semiconductor chips having metallic shaped bodies arranged thereon, that comprises the steps of arranging a plurality of metallic shaped bodies on a processed semiconductor wafer while forming a layer arranged between the semiconductor wafer and the shaped bodies, exhibiting a first connection material and a second connection material, and processing the first connection material for adhering the shaped bodies to the semiconductor wafer without processing the second connection material, wherein the semiconductor chips are separated either prior to arranging the shaped bodies on the semiconductor wafer or after processing the first connection material.

The processed semiconductor wafer already exhibits the electrical contacts on the semiconductor and corresponding insulations and is preferably already tested electrically (see above).

A connection material is understood to mean every material that, after it has been processed, creates a connection between the components mentioned, the connection permitting further processing in the pick and place method. The first connection material in particular differs from the second connection material in that they fulfil different tasks and require specific, differing chemical and/or physical parameters for being processed:

The first connection material is required to produce a provisional connection (provisional fastening, auxiliary fastening) between the shaped body and the chip, the connection enabling a lifting of the entire chip by lifting the shaped body. Involved here are in particular adhesion and cohesion forces as they are encountered in the case of adhesives that effect the adhering of the shaped body to the chip. Processing the adhesive, that is curing of the adhesive, for example takes place by applying temperature, pressure and/or light.

On the other hand the second connection material is required for a thermally and electrically conductive and mechanically high-strength "final" connection that is to take place in particular in an adhesive/cohesive manner.

The metallic shaped body need not extend over the dimensions of the individual semiconductor, but may, in some embodiments, undercut parts of the upper side. In many instances, the size and shapes of metallic shaped bodies may reflect the precise pattern of the electrical contacts of the semiconductor chip. That is to say, the size of the metallic shaped body reflects the size of the electrical contact that it is associated with, and it does not need to extend beyond that area. In other situations, it may extend beyond that area, but not extend beyond the edge of the upper surface of the semiconductor chip.

Preferably the first connection material is an adhesive and the second connection material is a solder material or a sintering material or the first connection material is a solder material and the second connection material is a sintering material.

In each case it is only important that the second connection material is not processed under conditions that are necessary for processing the first connection material.

Independently from this, the processing conditions for the second connection material, when they are applied, can lead to the situation that the first connection material even in the case of these conditions is processed (again) or destroyed or becomes functionless. In any case the first connection material or the parameters necessary for processing the materials have to be selected such that the final connection produced using the second connection material is not adversely affected by the first connection material.

If a wet cutting method is used for separating the semiconductor chips, i.e. a method where the wafer comes into contact with a liquid, this method is preferably applied before arranging the metallic shaped bodies on the processed semiconductor wafer. The wet cutting method can for example be a sawing method using water flushing or liquid-guided laser cutting.

If, on the other hand, for separating the semiconductor chips a dry cutting method is used, i.e. a separation method without using liquids acting on the wafer, this takes place either prior to arranging the metallic shaped body on the processed semiconductor wafer or after processing the first connection material.

Starting from this intermediate product manufactured by the method previously described, the invention also provides a method for manufacturing a semiconductor module exhibiting a substrate and a semiconductor chip having arranged thereon a metallic shaped body. This exhibits the steps of manufacturing a semiconductor chip having arranged thereon a metallic shaped body according to the previously mentioned method, arranging the semiconductor chip on the substrate while forming a layer of a third connection material arranged between the semiconductor chip and the substrate and processing the layer, arranged between the semiconductor chip and the substrate and the layer arranged between the metal shaped body and the semiconductor chip in one step.

The second connection material and the third connection material are preferably identical. As an alternative, the second and the third connection material can also be different chemically or physically—in each case it is important for their processing that the second and the third connection material exhibit similar parameters, so that the second and the third connection material can be jointly processed in one step.

There is further provided a semiconductor chip having arranged on its upper side a metallic shaped body that exhibits arranged between the shaped body and the semiconductor chip a layer containing a first connection material and a second connection material, the processing parameters of the first connection material not effecting a processing of the second connection material.

Preferably the first connection material is an adhesive and the second connection material is a solder material or a sintering material or the first connection material is a solder material and the second connection material is a sintering material.

Involved here is in particular a layer containing a first connection material (e.g. an adhesive) effecting the adhering of the metallic shaped body to the semiconductor chip and a second connection material (e.g. a solder or sintering material) effecting an adhesive/cohesive connection between the metallic shaped body and the semiconductor chip.

The first connection material and the second connection material are preferably arranged such that horizontally they are arranged separate from each other spatially.

In particular the first connection material in the layer is arranged in at least two areas horizontally separate from each other spatially.

Particularly preferably the first connection material is arranged surrounding the second connection material, i.e. framing it.

Finally also a wafer having plurality of the semiconductor chips mentioned previously is provided, the semiconductor chips preferably being arranged on a joint carrier film.

BRIEF DESCRIPTION OF THE DRAWINGS

The invention is explained in more detail below using an exemplary embodiment illustrated in the attached drawings and having a particularly preferred configuration. In the drawings.

DETAILED DESCRIPTION

Figure 1:
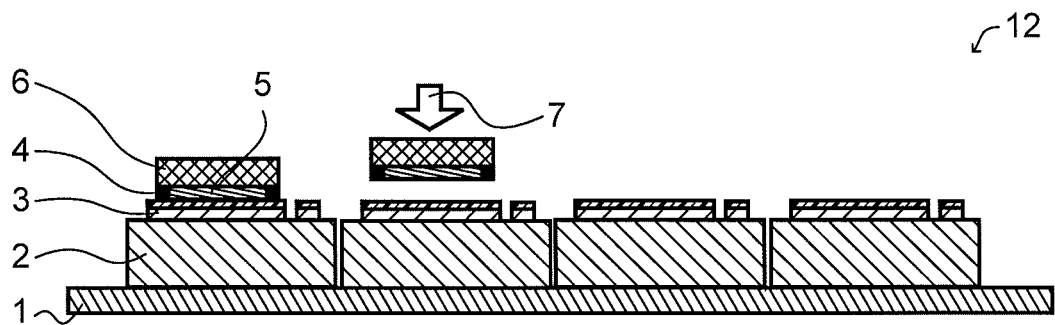
FIG. 1 shows a sectional view through a wafer having separate chips during the population process using metal shaped bodies.

FIG. 1 shows a sectional view through a wafer 12 having separate chips during the population process using metal shaped bodies. The wafer 12 exhibits a carrier film 1 (wafer film) that carries a plurality of semiconductor chips 2, 3 formed from a semiconductor component 2 and electrical contacts 3 formed on the semiconductor component 2.

During the population procedure 7 of the wafer 12 or of its chips 2, 3 with metallic shaped bodies 6, a layer, exhibiting a first connection material 4 and a second connection material 5, for example an adhesive 4 and a sintering material 5, is arranged between the metallic shaped body 6 and the surface of the chip 2, 3. This layer can be applied prior to positioning on the chips 2, 3 preferably on the lower side of the metallic shaped bodies 6.

So as to reduce the thermal-mechanical forces after the population on the wafer, according to a particularly preferred configuration the metallic shaped bodies 6 are also provided with a sintering layer (unsintered) 5 and an adhesive (polymer material) 4.

In the example shown, the chips 2, 3 are already sawn on the wafer and preferably tested electrically.

Figure 2:
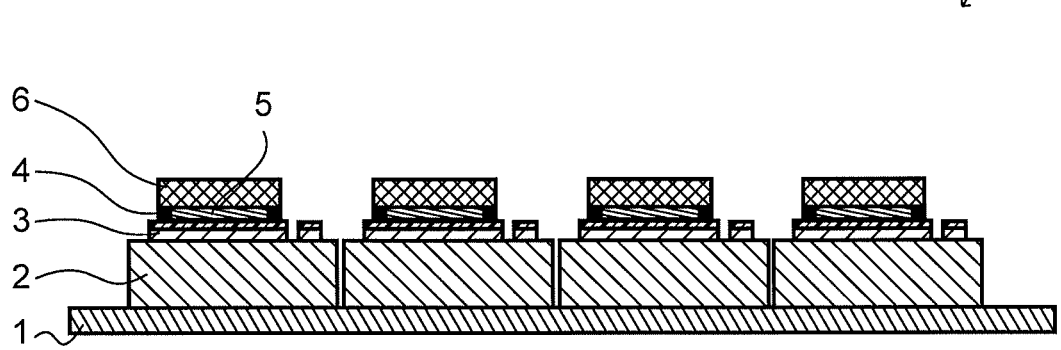
FIG. 2 shows a sectional view through the wafer from FIG. 1 with separate chips and metal shaped bodies fastened thereon.

FIG. 2 shows a population process, finished on a wafer, for the metal shaped bodies 6, where the metallic shaped bodies 6 have been immobilized on the chip surface under the influence of pressure with or without an applied temperature and/or light. This leads to the situation that as a result of the preferably used elastic polymer layer 4 adhering is made possible while maintaining an almost complete mechanical relaxation between the metallic shaped body 6 and the wafer, this again leading to less bending-through of the wafer composite (metallic shaped body with semiconductor layer). This again has the advantage that handling is markedly simplified and also wafers having lower thicknesses (below 150 μm) remain processable.

Here the individual metallic shaped bodies 6 are placed serially or also as a composite (by means of a carrier film) on the respective semiconductor. Since after sawing, the precision on the wafer level still exists, it is possible to securely place the carrier film 1 with the populated metallic shaped bodies 6.

Figure 3:
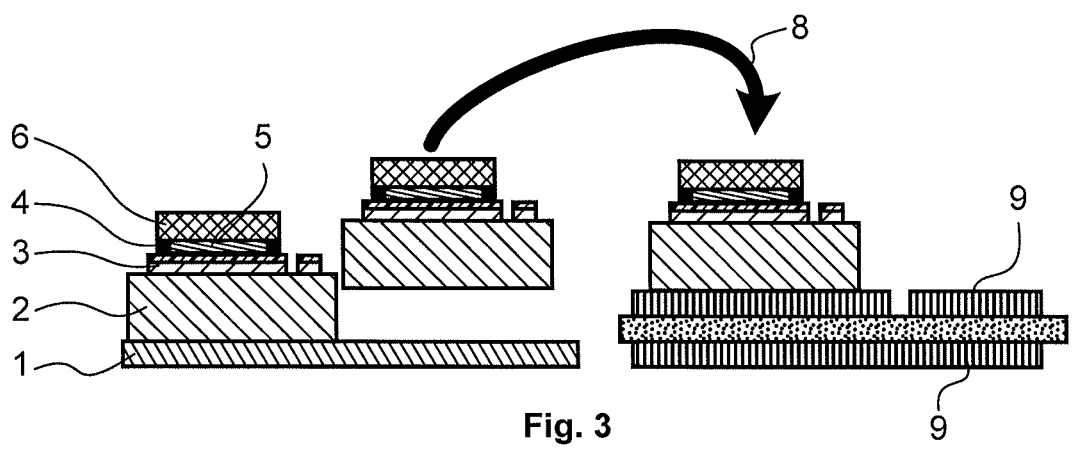
FIG. 3 shows a sectional view of the wafer from FIG. 2 during the population process of the chips on a substrate.

FIG. 3 shows the population process of a chip 2, 3 carrying a metal shaped body 6, on a substrate 9, 10 (such as a DBC—direct bonded copper substrate) formed from ceramic 10 and copper 9. The entire chip 2, 3 including shaped body 6 can be lifted by the shaped body 6 on account of the auxiliary fastening to the chip 2, 3 and positioned on the substrate 9, 10.

In a step (not shown) taking place thereafter, the connection of chip 2, 3 and substrate 9, 10 can take place, wherein simultaneously also the final connection of metallic shaped body 6 and chip 2, 3 takes place.

Figure 4:
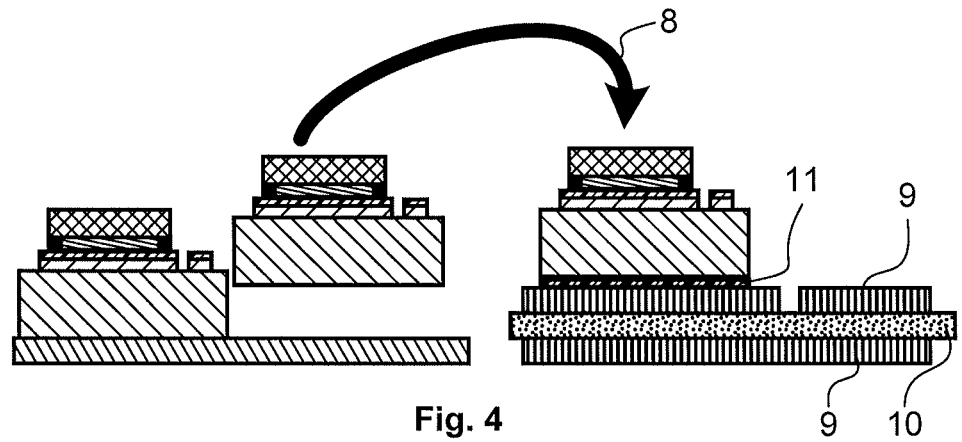
FIG. 4 shows a sectional view of the wafer from FIG. 2 during the population process of the chips on a substrate utilising a further embodiment.

FIG. 4 shows the population process of a chip 2, 3 carrying a metal shaped body 6, on a substrate 9, 10 (such as a DBC—direct bonded copper substrate) formed from ceramic 10 and copper 9. The entire chip 2, 3 including shaped body 6 can be lifted by the shaped body 6 on account of the auxiliary fastening to the chip 2, 3 and positioned on the substrate 9, 10. Here, a layer of a third connection material 11 is arranged between the semiconductor chip 2, 3 and the substrate 9, 10.

In a step (not shown) taking place thereafter, the connection of chip 2, 3 and substrate 9, 10 can take place, wherein simultaneously also the final connection of metallic shaped body 6 and chip 2, 3 takes place. The second connection material 5 and the third connection material 11 are preferably identical. As an alternative, the second connection material 5 and the third connection material 11 can also be different chemically or physically—in each case it is important for their processing that the second connection material 5 and the third connection material 11 exhibit similar parameters, so that the second connection material 5 and the third connection material 11 can be jointly processed in one step.

Figure 5:
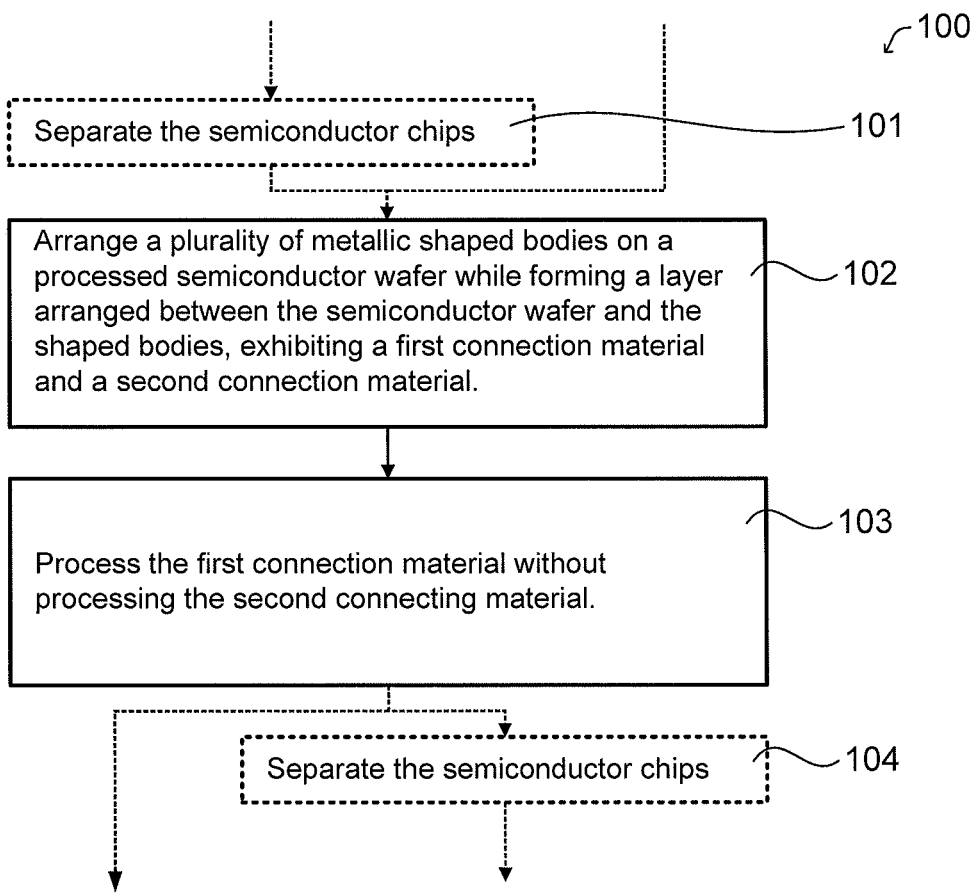
FIG. 5 shows a flow diagram of the inventive method.

FIG. 5 shows a flow diagram of the inventive method, where the method 100 comprises the following steps:
arrange 102 metallic shaped bodies on a wafer with a layer exhibiting a first connection material and a second connection material
process 103 the first connection material
separate 104, 105 the semiconductor chips
wherein the final step can optionally occur before 103 the arrangement of the metallic shaped bodies or after 104 the processing of the first connection material.

Figure 6:
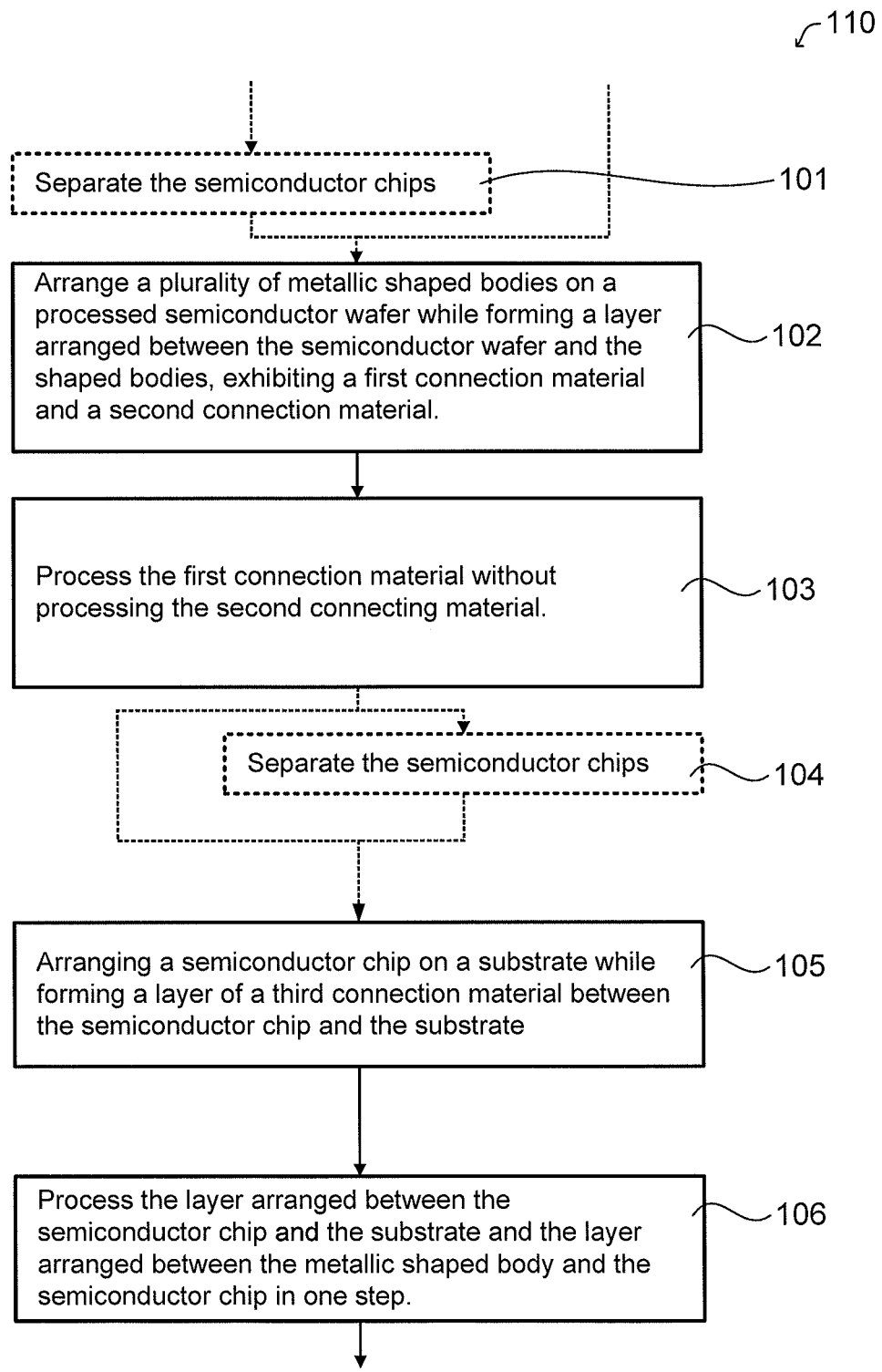
FIG. 6 shows a flow diagram of an extension of the inventive method.

FIG. 6 shows a flow diagram of a further extension of the inventive method, where the method 110 comprises the following steps in addition to those described above:
arrange 105 a semiconductor chip on a substrate while forming a layer of a third connection material between the semiconductor chip and the substrate,
process 106 the layer arranged between the semiconductor chip and the substrate and the layer arranged between the metallic shaped body and the semiconductor chip in one step.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A method for manufacturing semiconductor chips having arranged thereon metallic shaped bodies, having the following steps:
arranging a plurality of metallic shaped bodies on a processed semiconductor wafer while forming a layer arranged between the semiconductor wafer and the metallic shaped body, exhibiting a first connection material and a second connection material, and
processing the first connection material for connecting the metallic shaped bodies to the semiconductor wafer without processing the second connecting material,
wherein the semiconductor chips are separated either prior to arranging the metallic shaped bodies on the semiconductor wafer or after processing the first connection material.

2. The method according to claim 1, wherein
the first connection material is an adhesive and the second connection material is a solder material or a sintering material
or
the first connection material is a solder material and the second connection material is a sintering material.

3. The method according to claim 2, wherein separating the semiconductor chips takes place prior to arranging the metallic shaped bodies on the processed semiconductor wafer using a wet cutting method.

4. The method according to claim 2, wherein separating the semiconductor chips takes place after processing the first connection material using a dry cutting method.

5. A method for manufacturing a semiconductor module exhibiting a substrate and a semiconductor chip having arranged thereon a metallic shaped body, having the following steps:
manufacturing a semiconductor chip having arranged thereon a metallic shaped body according to claim 2,
arranging the semiconductor chip on the substrate while forming a layer of a third connection material arranged between the semiconductor chip and the substrate, and
processing the layer arranged between the semiconductor chip on the substrate and the layer arranged between the metallic shaped body and the semiconductor chip in one step.

6. The method according to claim 1, wherein separating the semiconductor chips takes place prior to arranging the metallic shaped bodies on the processed semiconductor wafer using a wet cutting method.

7. A method for manufacturing a semiconductor module exhibiting a substrate and a semiconductor chip having arranged thereon a metallic shaped body , having the following steps:
manufacturing a semiconductor chip having arranged thereon a metallic shaped body according to claim 6,
arranging the semiconductor chip on the substrate while forming a layer of a third connection material arranged between the semiconductor chip and the substrate, and
processing the layer arranged between the semiconductor chip on the substrate and the layer arranged between the metallic shaped body and the semiconductor chip in one step.

8. The method according to claim 1, wherein separating the semiconductor chips takes place after processing the first connection material using a dry cutting method.

9. A method for manufacturing a semiconductor module exhibiting a substrate and a semiconductor chip having arranged thereon a metallic shaped body , having the following steps:
manufacturing a semiconductor chip having arranged thereon a metallic shaped body according to claim 8,
arranging the semiconductor chip on the substrate while forming a layer of a third connection material arranged between the semiconductor chip and the substrate, and
processing the layer arranged between the semiconductor chip on the substrate and the layer arranged between the metallic shaped body and the semiconductor chip in one step.

10. A method for manufacturing a semiconductor module exhibiting a substrate and a semiconductor chip having arranged thereon a metallic shaped body, having the following steps:
- manufacturing a semiconductor chip having arranged thereon a metallic shaped body according to claim 1,
- arranging the semiconductor chip on the substrate while forming a layer of a third connection material arranged between the semiconductor chip and the substrate, and
- processing the layer arranged between the semiconductor chip and the substrate and the layer arranged between the metallic shaped body and the semiconductor chip in one step.

11. The method according to claim 10, wherein the second connection material and the third connection material are identical.

* * * * *